United States Patent [19]

Saleh

[11] Patent Number: 5,349,352
[45] Date of Patent: Sep. 20, 1994

[54] ANALOG-TO-DIGITAL CONVERTER HAVING HIGH AC LINE NOISE REJECTION AND INSENSITIVE TO AC LINE FREQUENCY VARIATIONS

[75] Inventor: Farid Saleh, San Jose, Calif.
[73] Assignee: Harris Corporation, Melbourne, Fla.
[21] Appl. No.: 994,008
[22] Filed: Dec. 21, 1992
[51] Int. Cl.[5] .............................................. H03M 3/02
[52] U.S. Cl. ..................................... 341/143; 341/166
[58] Field of Search ................. 341/143, 166, 167, 168

[56] References Cited

U.S. PATENT DOCUMENTS

| | | | |
|---|---|---|---|
| 4,195,235 | 3/1980 | Schoeff | 307/229 |
| 4,595,906 | 6/1986 | Bingham | 341/138 |
| 4,833,474 | 5/1989 | Nagai et al. | 341/166 |
| 4,972,436 | 11/1990 | Halim et al. | 375/28 |
| 5,157,395 | 10/1992 | Del Signore et al. | 341/143 |
| 5,179,380 | 1/1993 | White | 341/143 |
| 5,198,817 | 3/1993 | Walden et al. | 341/143 |

Primary Examiner—Marc S. Hoff
Attorney, Agent, or Firm—Henry I. Schanzer; Daniel J. Staudt; William A. Troner

[57] ABSTRACT

Analog-to-digital (AID) converters with power line frequency noise rejection by synchronization of the converter clock with the power line frequency through a phase locked loop. Both sigma delta and integrating A/D converters may use the synchronized clock to precisely reject power line frequency noise.

16 Claims, 10 Drawing Sheets

FIRST NOTCH FREQUENCY $= \dfrac{f_{CLK}}{C}$

C: AN INTEGER, A CONSTANT DESIGN PARAMETER

ANALOG-TO-DIGITAL CONVERTER HAVING HIGH AC LINE NOISE REJECTION AND INSENSITIVE TO AC LINE FREQUENCY VARIATIONS

CROSS-REFERENCE TO RELATED APPLICATIONS

Cofiled U.S. patent application Ser. No. 993,585, filed Dec. 12, 1992, naming John Sramek as sole inventor, discloses related subject matter and is assigned to the assignee of the present application. This cross-referenced application is hereby incorporated by reference.

BACKGROUND OF THE INVENTION

1. Field of the Invention

The present invention relates to Analog-to-Digital conversion of electrical signals and, more particularly, to apparatus and methods of rejecting the power line-frequency noise within the process of conversion.

2. Description of Related Art

Digital processing and transmission of electrical signals has become commonplace in many industrial and consumer applications. Applying digital methods to analog information requires an analog-to-digital (A/D) conversion, but the needed linearity, resolution, and speed of such a conversion depends on the application. For example, many industrial control applications require A/D conversion with good linearity and high resolution (12–24 bits) but the necessary conversion or data throughput rate is relatively slow (20 Hz or less); whereas, video applications demand high speed (20 MHz or more) but tolerate lower resolution (8 bits) and poorer linearity. Intermediate speed applications (12 bits, 1–5 MHz) appear in document scanners and facsimile machines.

Industrial control and test and measurement applications typically monitor parameters, such as pressure and temperature, that essentially are slow time varying dc voltage levels. The measurements are performed by using a transducer to sense the physical parameter and generate an analog electrical signal that the A/D converter transforms into a digital representation for processing in a computer or microprocessor.

There are three types of A/D converters typically used in these industrial control applications: (1) integrating converters with 8 to 16 bit resolution which are inexpensive but slow (usually less than 50 conversions per second); (2) successive approximation register (SAR) converters with 12 to 16 bit resolution which are much faster, however, these converters with their required sample-and-hold circuit are very expensive; and (3) sigma delta converters with 16 to 22 bit resolution which are inexpensive but slow based on existing architectures.

Sigma delta analog-to-digital converters consist of two major elements, a modulator that oversamples and digitizes an input analog signal, and a digital filter that removes unwanted noise. In low frequency industrial control and test and measurement applications, the filtering operation must remove internally generated quantization and other noise and externally generated interference noise.

The most common form of interference noise for industrial control and test and measurement instruments is AC power-line noise with the frequencies of 50 of 60 Hz and their harmonics. The mechanism of A C line noise intereference is inductive and/or capacitive coupling of power-line-frequency to sensor leads and to the imput of measurement circuitry. The coupled signal forms a normal mode noise superimposed on the signal of interest to be measured. This noise must be removed from the signal of interest or be rejected during the analog to digital conversion for an accurate result.

The usual solution to such a noise problem is the inclusion of a lowpass filter at the input of an A/D converter. FIG. 1 shows a block diagram of such a solution. In order to achieve an acceptable accuracy in the filter's passband and high rejection in the filter's stopband, a very high order filter should be used. This is often complicated and expensive filter. In addition, the filter has a long setting time to be added to the A/D conversion time.

Another technique for improving the AC line-frequency rejection is the use of the inherent characteristics of the A/D converter. This in particular, is applicable to sigma delta and integrating A/D converters. These A/D converters have the following inherent properties in common:

1. The frequency response of their input-output transfer function have multiple zeros which provide notch filter characteristics and allows selected frequencies to be highly rejected.

2. The frequency response of their input-output transfer function, and more particularly the location of the zeroes, is a function of the A/D converter clock frequency.

From the above properties, the AC line-frequency will be rejected if it lies at one of the zeroes of the A/D converter transfer function. In all the implementations this can be accomplished by selection of the clock frequency to be an appropriate fixed integer multiple of the AC line-frequency. A crystal oscillator is often used for clock generation to provide a stable clock frequency. FIG. 2 shows a block diagram of such a solution eliminating the need of filter in FIG. 1.

As a first example, sigma-delta converters often use a digital comb filter for the digital filtering of the sigma-delta modulator output due to its acceptable performance with a simple implementation. A sigma-delta modulator of order L requires a comb filter with the order of $N=L+1$ to provide adequate quantization noise attenuation. An Nth order comb filter has an amplitude frequency response of $[\sin(\pi f/F)/(\pi f/F)]^N$ where f is the input frequency and F is the first notch frequency of the filter. FIG. 3 shows a typical amplitude frequency response of a comb filter for $N=3$ and $F=10$ Hz for the input frequency range of $f=0$ to 100 Hz. It can be seen that by designing the comb filter with its first notch frequency as an integral fraction of the AC line-frequency, the rejection of AC line noise will be very high.

As a second example, the cross-referenced patent application of Sramek provides a sigma-delta converter architecture which uses a high cutoff lowpass and decimation digital filter (with a passband much beyond the 50 or 60 Hz frequency of the AC line) to digitize the signal at an output rate which is a multiple of the AC line frequency. Then a simple running average of its last M output samples is computed to average out and reject the AC line-frequency. The normal mode rejection ratio of the running average block versus frequency has the form of $M\sin(P)/\Sigma[\sin(P+(2\pi mf)/F)]$ with summation over
m=0,1,...,M-1 where M is the number of samples to be averaged, F is the input data sampling rate for the running average block (which is the output rate of the high cutoff and decimation digital filter), P is the phase shift of the input sine wave to the $M^{th}$ previous sample and f is the frequency of the input sine wave. FIG. 4 shows a typical normal mode rejection ratio (NMRR) of this architecture for M=4, F=240 Hz and P=$\pi$/4 for the input frequency range of f=0 to 240 Hz. It can be seen that, by proper selection of M and F the AC line frequency 60 Hz can be highly rejected during the running average computation.

As a third example, integrating converters use a fixed time interval for integration of the input signal. The integrator output voltage at the end of the fixed time interval is proportional to the input and will be converted to a digital representation in the following phases of the conversion cycle. The normal mode rejection of the integrating converter is defined as a ratio of the integrator output for a DC input (frequency of zero) to the integrator output for a sinusoidal input. The normal mode rejection ratio of an integrating converter has the form of $(2\pi fT)/(\cos P-\cos(2\pi fT+P))$ where f is the input signal frequency, T is the integrating time interval and P is the phase shift of the input signal to the start of the integration phase. FIG. 5 shows a typical NMRR of an integrating converter for T=1/60 of a second, P=$\pi$/2 (worst case) and input frequency range of f=0 to 180 Hz. It can be seen that by proper selection of the T the AC line frequency (60 Hz) can be highly rejected during the integration cycle of the converter.

The architecture shown in FIG. 2 is widely used in conjunction with the mentioned A/D converters for precision measurement of DC and slow varying signals. However, this architecture has a problem of not accounting for the frequency variations of the AC power line. Unfortunately, deviation of the line frequency of ±2 Hz (up to ±3 Hz in the worst case) are normal. This variation drastically reduces the NMRR of the AC line-frequency while the crystal clock frequency is stable. FIG. 6 shows the same frequency response as of FIG. 3 for ±2 Hz variation about 60 Hz. It can be seen that due to the narrowness of the notch characteristics the AC line-frequency rejection will drop to about 90 dB from better that 180 dB for frequencies of 58 and 62 Hz. FIG. 7 and 8 show the same NMRR as of FIGS. 4 and 5 respectively for ±2 Hz variation about the 60 Hz. It can also be seen in both cases that rejection of the AC line frequency will drop significantly for frequencies deviated from 60 Hz.

SUMMARY OF THE INVENTION

It is the object of the present invention to provide a technique for high and stable rejection of AC line-frequency noise in A/D converters which is insensitive to AC line-frequency variations. It is another object of the present invention to provide high and stable rejection of any periodic source of noise in A/D converters provided that the frequency of the noise source is known and available.

These objects and advantages are achieved in Sigma-delta A/D converters with comb filters and in Sigma-delta A/D converters with high cutoff lowpass and decimation digital filter followed by running average falter and in integrating A/D converters in which the clock frequency of the A/D converter is continuously adapted to AC line frequency. The adaptation of the A/D converter clock frequency assures that the clock frequency continuously remains an appropriate fixed integer multiple of the AC line-frequency concurrent to line frequency variations. The adaption of the A/D converter clock frequency to AC line-frequency is achieved by using a phase-locked-loop circuit as an A/D converter clock generator while the AC line frequency is used as a reference frequency to the phase-locked-loop. FIG. 9 shows the block diagram of a phase-locked-loop clock A/D converter. As will be made clear in the detailed description of the preferred embodiments, the adaption of an A/D converter clock frequency to AC line-frequency is achieved through proper selection of design parameters in the A/D converter and the phase-locked-loop.

BRIEF DESCRIPTION OF THE DRAWINGS

The present invention will be described with reference to the accompanying drawings.

DESCRIPTION OF THE PREFERRED EMBODIMENTS

Sigma-delta A/D Converter with Digital Comb Filter

Figure 10:
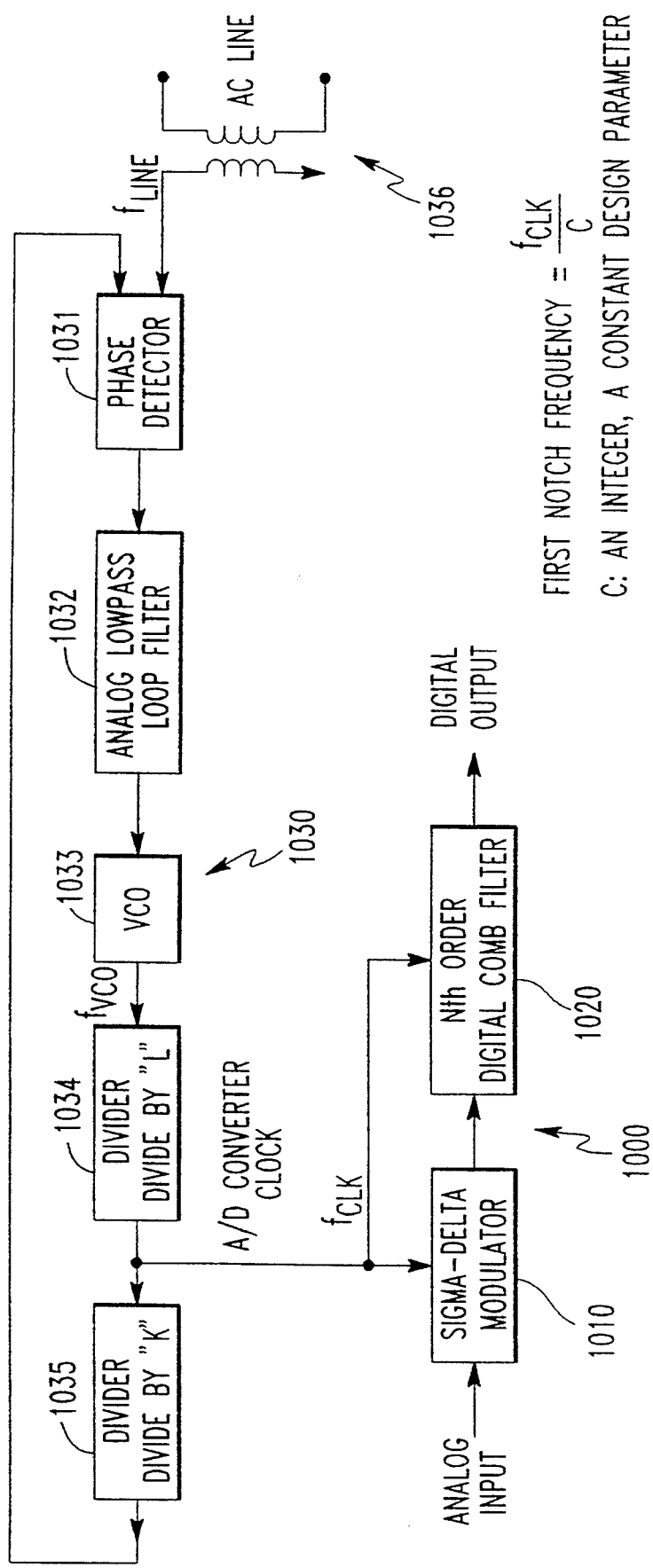
FIG. 10 is a simplified block diagram of a preferred embodiment of the invention for a Sigma-delta converter with digital comb filter.

FIG. 10 schematically shows a first preferred embodiment Sigma-delta A/D converter, generally denoted with reference numeral 1000, which includes Sigma-delta modulator 1010, $N_{th}$ order digital comb filter 1020, and phase-locked-loop clock generator 1030. The phase-locked-loop 1030 generates a clock for driving the A/D converter which is locked to $f_{LINE}$ provided through coupling transformer 1036. The AC line frequency $f_{LINE}$ will be about 50 Hz or about 60 Hz.

Phase-locked-loop 1030 has a general architecture, which includes phase detector 1031, analog lowpass loop filter 1032, voltage controlled oscillator (VCO) 1033, and divide by L frequency divider 1034 followed by divide by K frequency divider 1035. The A/D converter clock is obtained from the output of divider 1034. Coupling transformer 1036 provides the reference input frequency, $f_{LINE}$ to phase detector 1031. Phase detector 1031 compares the AC line-frequency, $f_{LINE}$, with the output from divider 1035. Any difference between $f_{LINE}$ and the output of the divider 1035 will generate an output at the phase detector 1031. This output will be smoothed by the analog lowpass loop filter 1032 and will drive the VCO 1033 to correct for the frequency difference at the inputs of the phase detector 1031. The loop always locks to a stable state when the VCO 1033 output frequency, $f_{VCO}$ is $K \times L \times f_{LINE}$. Consequently, the Sigma-delta A/D converter clock frequency, $f_{CLK}$, is $f_{CLK} = K \times f_{LINE}$. This insures that the clock driving the digital comb filter 1020 has a frequency which is exact multiple integer of the AC line-frequency $f_{LINE}$. The first notch frequency ($f_{1st-notch}$) of the digital comb filter 1020 equals $f_{CLK}/C$, where C is a constant integer and is an A/D converter design parameter (C basically is the number of taps in the comb filter). The nth-notch frequency ($f_{nth\ notch}$) of the digital comb filter 1020, which is just n times the first-notch frequency, equals $n \times f_{CLK}/C$. Substituting $f_{CLK} = K \times f_{LINE}$ yields:

$$f_{nth\ notch} = (n \times K/C) f_{LINE}$$

Hence, AC line noise at frequency of $f_{LINE}$ is specifically removed by comb filter 1020 when the phase-locked-loop 1030 and comb filter 1020 are designed so that $n \times K/C = 1$. This will insure that AC line-frequency will fall in the nth-notch of comb filter 1020 and will be effectively rejected. This will also insure that any variation in the AC line-frequency, $f_{LINE}$, will be followed by $f_{CLK}$ and hence by $f_{nth\ notch}$. Further, the harmonics of $f_{LINE}$ (the AC line noise) will then fall into higher notch frequencies and also be rejected. In particular, for a Sigma-delta A/D converter with nominal clock frequency of 10 MHz the design will be as follows: Assuming the first-notch frequency of the comb filter 1020 is to be at 10 Hz and the AC line-frequency is 60 Hz nominal. Then the 6th-notch frequency of the filter 1020 will fall at the AC line-frequency. Referring to equation $n \times K/C = 1$ for $n = 6$ and C approximately equal to $10^6$ ($f_{1st-notch} = 10$ MHz/C), K will be approximately 166666. The appropriate integer values of $C = 2^{20}$ (1,048,576), $K = 174,762$, and $L = 1$ will be selected. For these values:

| |
|---|
| $f_{LINE} = 60$ Hz will result in $f_{CLK} = 10,485,720$ Hz |
| $f_{LINE} = 58$ Hz will result in $f_{CLK} = 10,136,196$ Hz |
| $f_{LINE} = 62$ Hz will result in $f_{CLK} = 10,835,244$ Hz |

Thus the clock frequency follows the AC line frequency and as the line frequency increases or decreases converter 1000 samples faster or slower.

Alternative choices for n, K, and C can yield a lower frequency clock. For example, $n = 1$ and $K = C = 1000$ lead to $f_{CLK} = 60,000$ Hz when $f_{LINE} = 60$ Hz.

Figure 11:
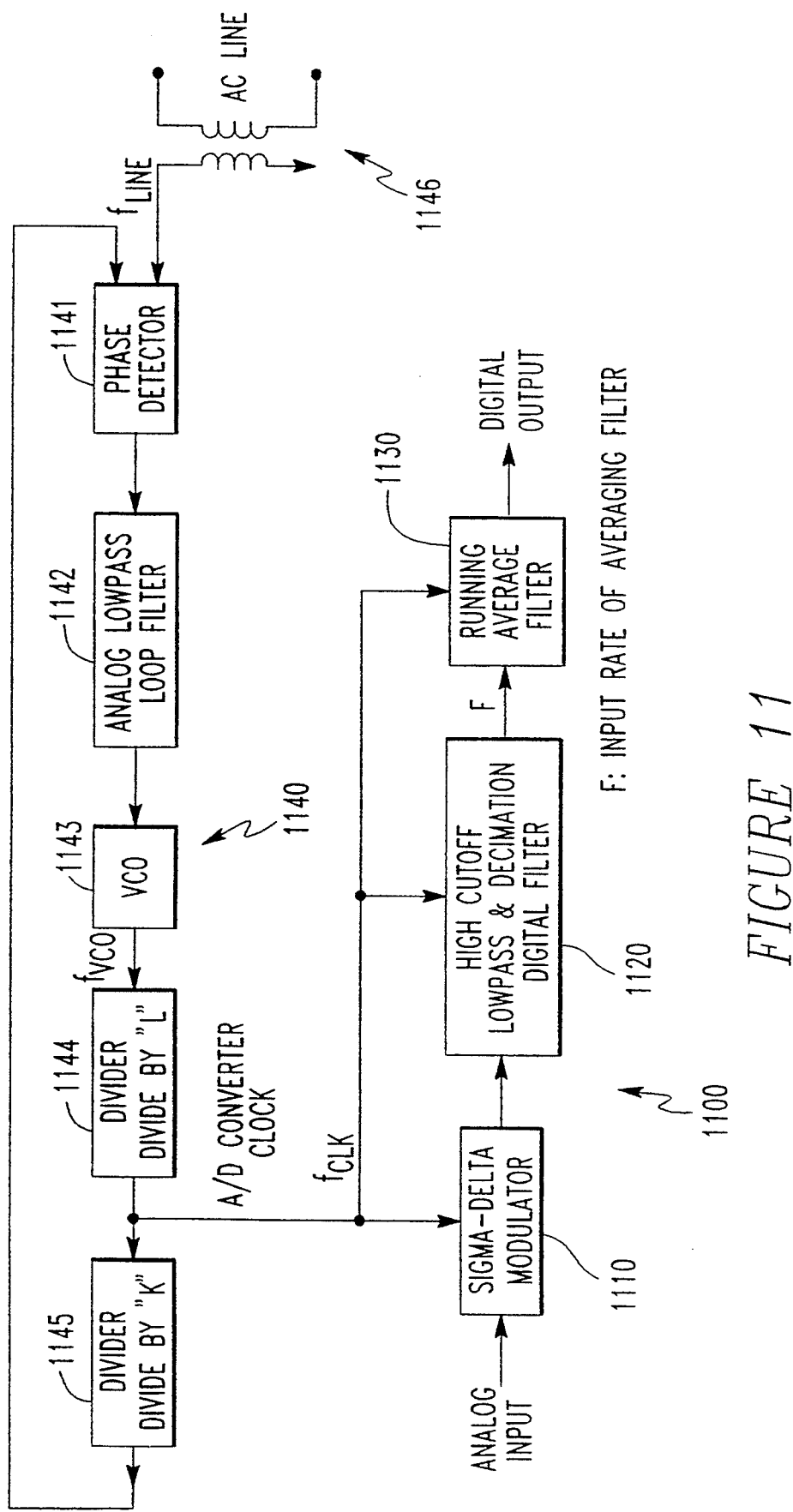
FIG. 11 is the preferred embodiment for a Sigma-delta converter with high cutoff low pass and decmination digital filter followed by a running average filter.

Sigma-delta A/D Converters With High Cutoff Lowpass and Decimation Digital Filter Followed by a Running Average Filter FIG. 11 schematically shows in block diagram form a second preferred embodiment Sigma-Delta A/D converter, generally denoted with reference numeral 1100, which includes Sigma-Delta modulator 1110, high cutoff lowpass and decimation digital filter 1120, running average filter 1130, and phase-locked-loop clock generator 1140. As was described for the first preferred embodiment, the phase-locked-loop 1140 provides a clock for the A/D converter which is locked to the AC line-frequency and that is $f_{CLK} = K \times f_{LINE}$. The running average filter 1130 receives the data from filter 1120 at the sampling rate of F which is nominally M times the AC line-frequency. The running average filter 1130 generates a running average of M samples by adding the most recent sample and subtracting the Mth-previous sample. The output rate of filter 1120 equals $F = f_{CLK}/C$, where C is a constant integer and is an A/D converter design parameter. The lowest notch frequency of the averaging filter 1130 is $f_{lowest\ notch} = F/M$. Substituting $F = f_{CLK}/C$ and $f_{CLK} = K \times f_{LINE}$ will yield $f_{lowest\ notch} = (K/C \times M) f_{LINE}$. Hence, AC line noise at frequency of $f_{LINE}$ is specially removed by the averaging filter 1130 when the phase-locked-loop 1140, high cutoff filter 1120 and averaging filter 1130 are designed so that $K/C \times M = 1$. This will insure that AC line-frequency will fall in the lowest notch of the averaging filter 1130 and will be effectively rejected. This will also insure that any deviation in the AC line-frequency will be followed by the $f_{CLK}$ and hence by the f-notch. In particular, for a Sigma-Delta A/D converter with nominal clock frequency of 500 KHz the design will be as follows. Assuming $M = 4$ and referring to the equation $K/C \times M = 1$, the appropriate integer values for K and C will be, $K = 8192$ and $C = 2048$. Choosing a value of $L = 2$ will result in a VCO with nominal frequency of about 1 MHz. For these values, $f_{LINE} = 60$ will yield $f_{CLK} = 491,520$ Hz, $f_{LINE} = 58$ will give $f_{CLK} = 475,136$ Hz, $f_{LINE} = 62$ will lead to $f_{CLK} = 507,904$ Hz.

High cutoff lowpass filter 1120 could be a comb filter with a first notch at 1000 Hz or higher. In this case filter 1120 essentially filters out quantization noise of modulator 1110 and has no effect on the $f_{LINE}$ noise. And M could be greater than 4 to insure rejection of higher harmonics such as $4 f_{LINE}$.

Integrating A/D Converter

Figure 1:
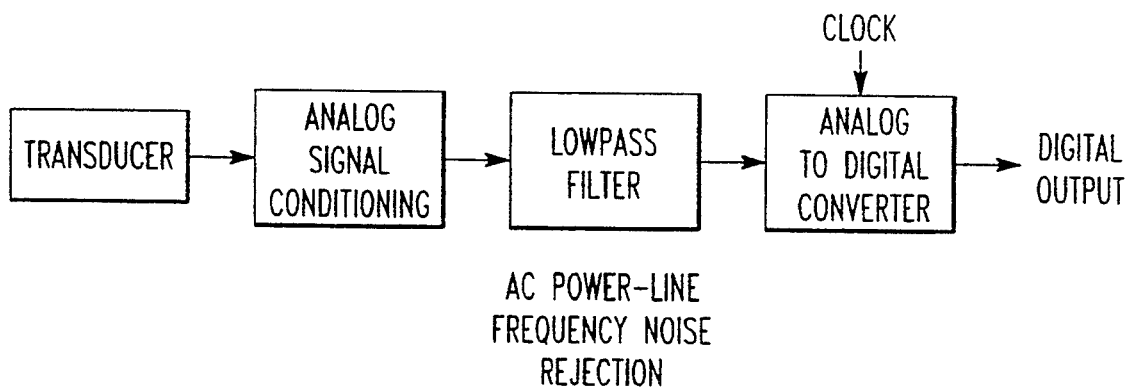
FIG. 1 is a simplified block diagram of a prior art measurement system with an A/D converter including a lowpass filter for AC line-frequency rejection.
Figure 2:
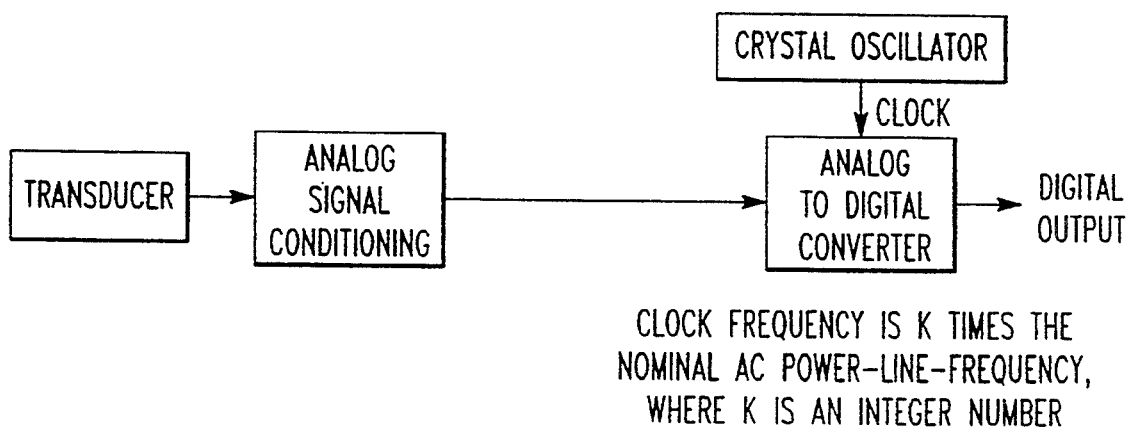
FIG. 2 is a simplified block diagram of a system like the system of FIG. 1 using A/D converter clock frequency for AC line-frequency rejection.
Figure 3:
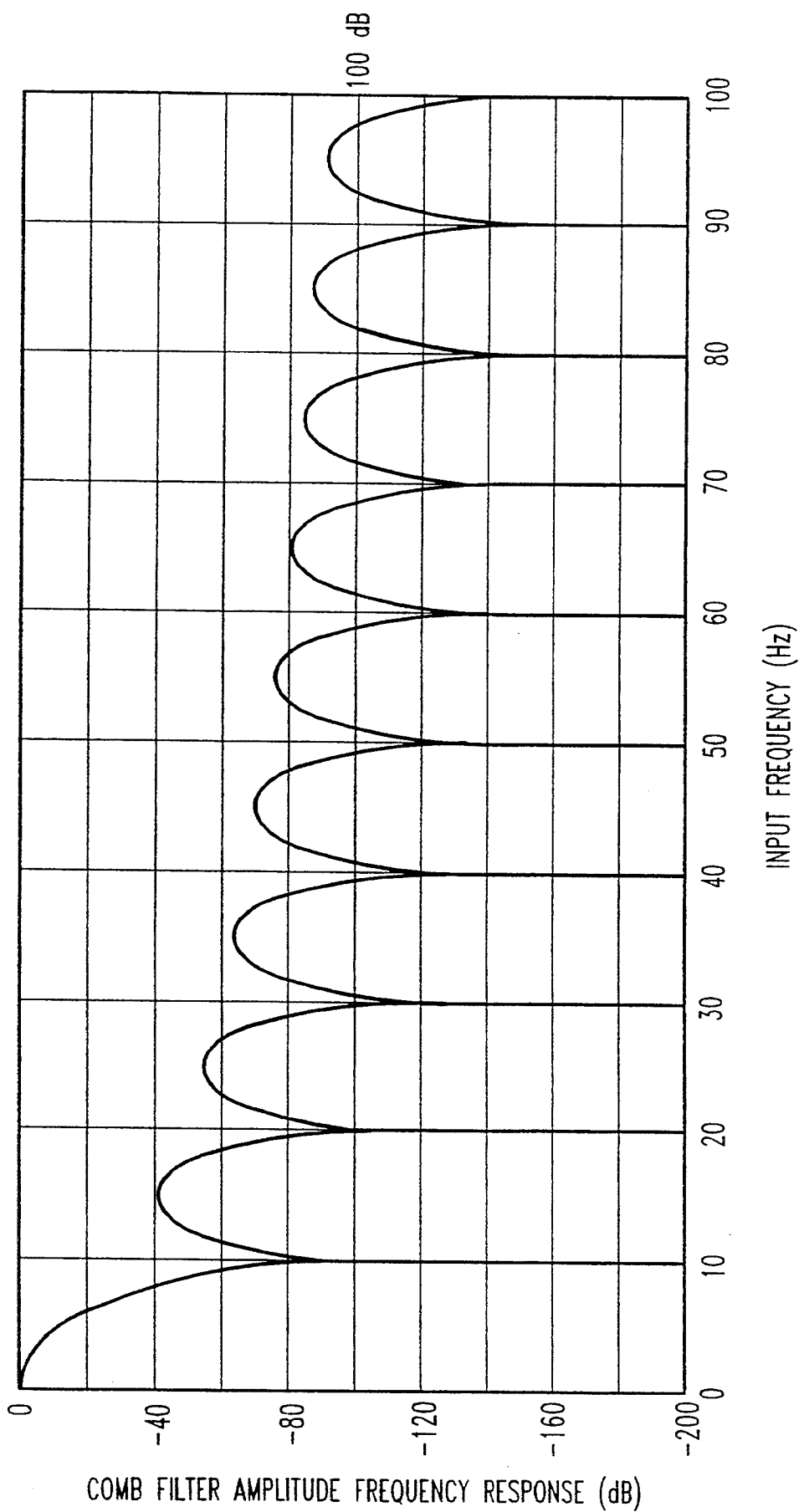
FIG. 3 is a typical frequency response characteristic of a digital comb filter.
Figure 4:
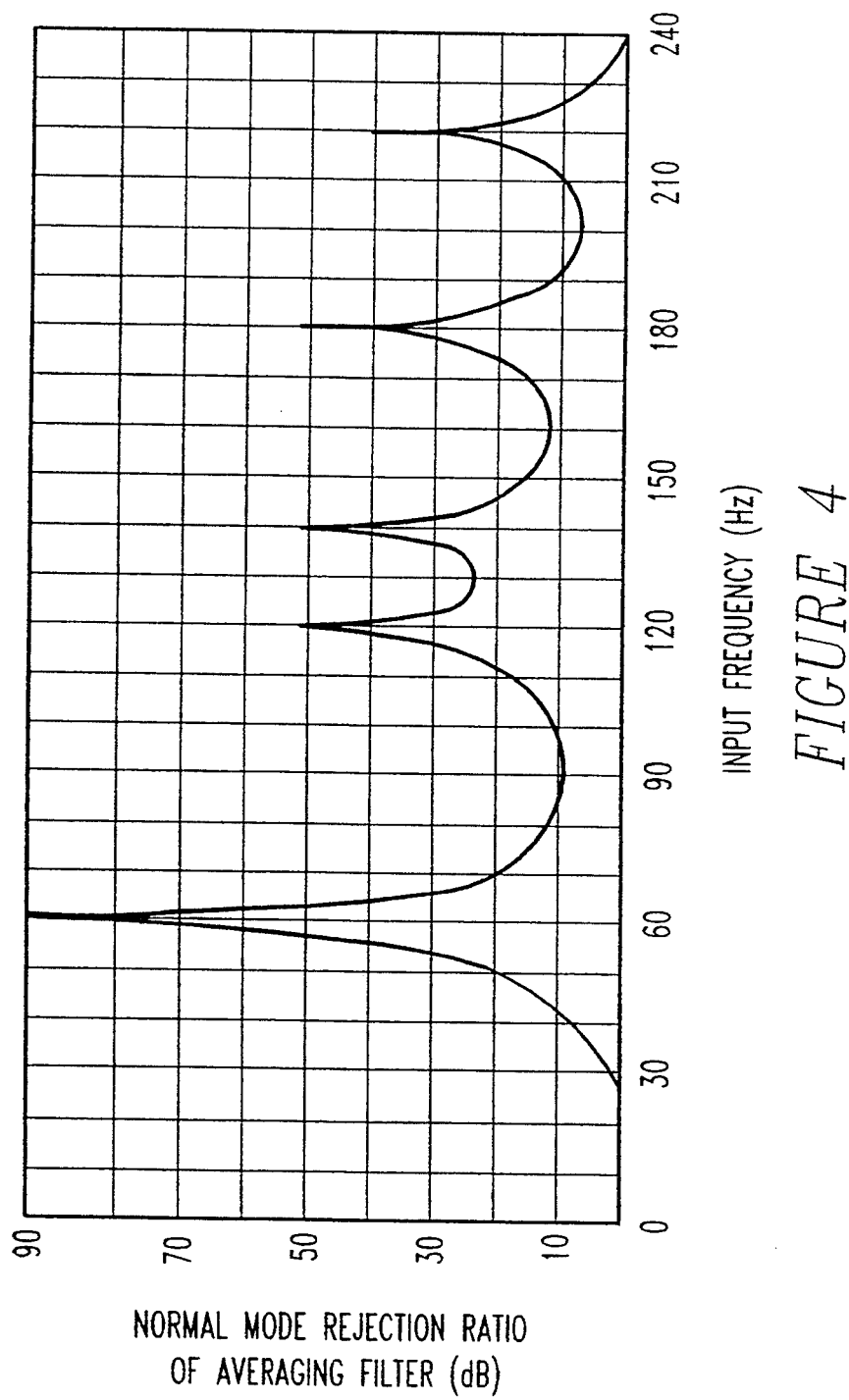
FIG. 4 is a typical normal mode rejection ratio characteristics of a running average filter.
Figure 5:
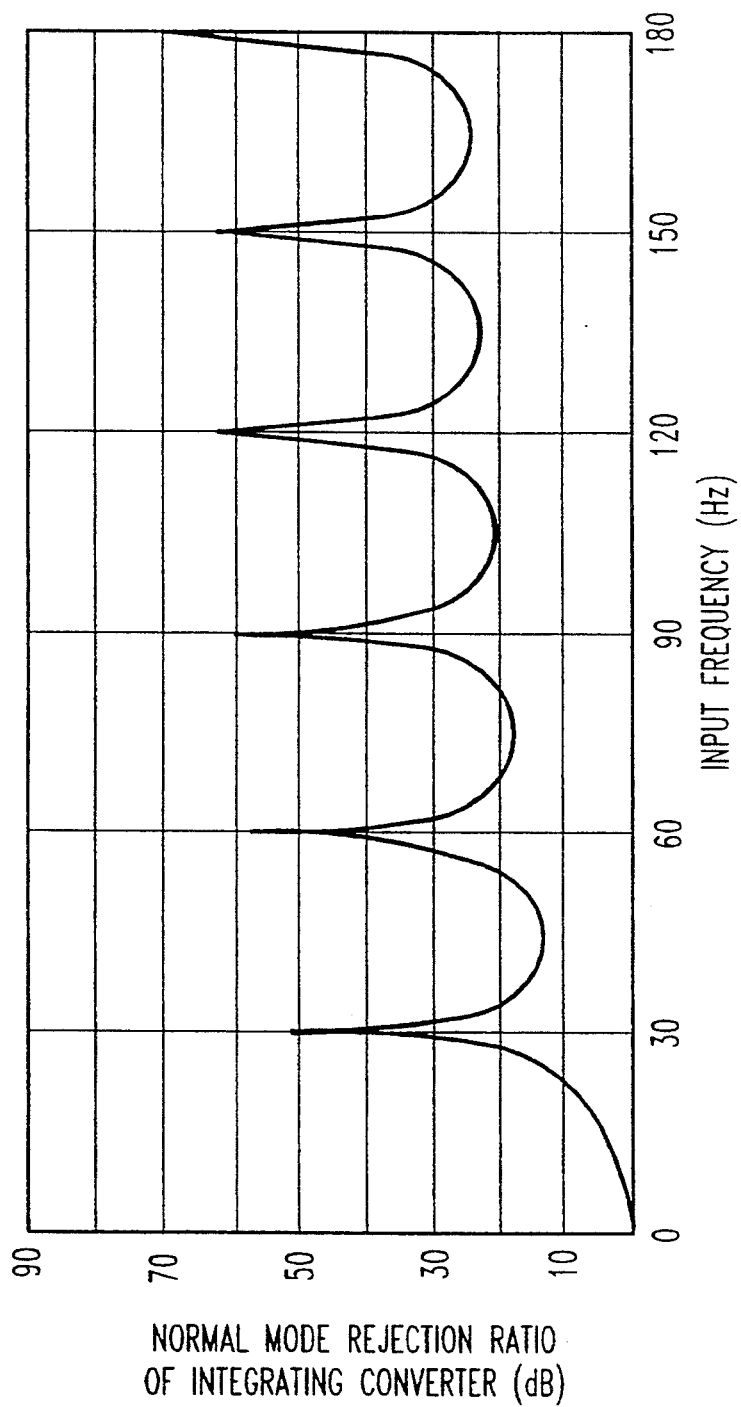
FIG. 5 is a typical normal mode rejection ratio characteristics of an integrating A/D converter.
Figure 6:
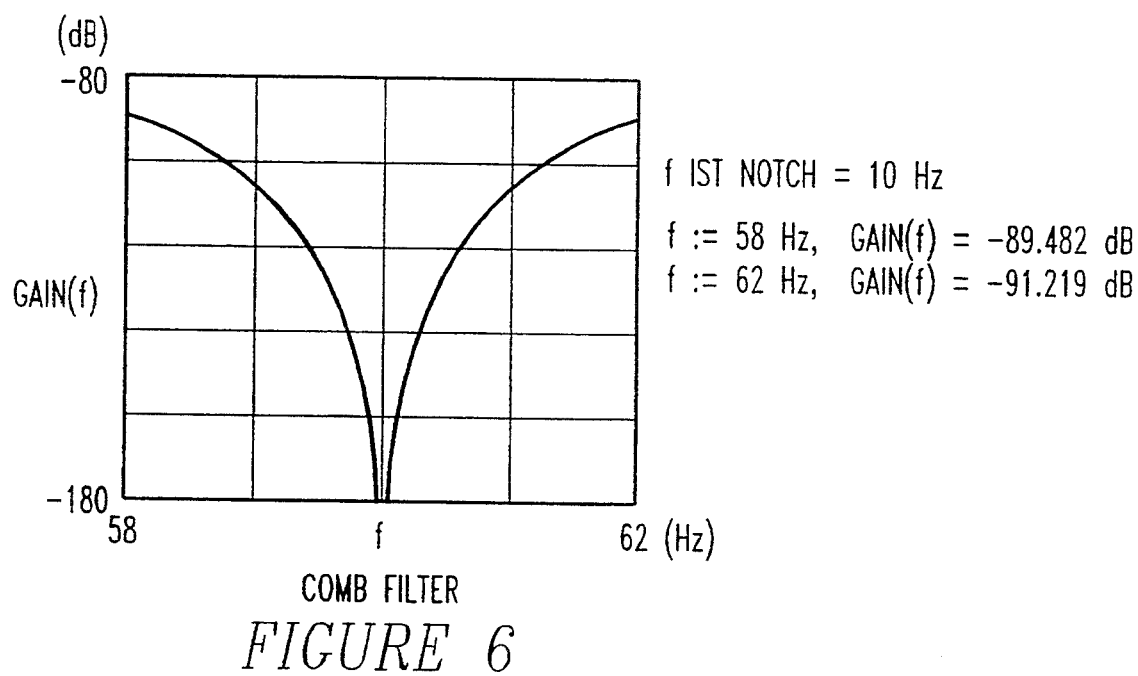
FIG. 6 is the same characteristics as of FIG. 3 for frequency range of 58 to 60 Hz.
Figure 7:
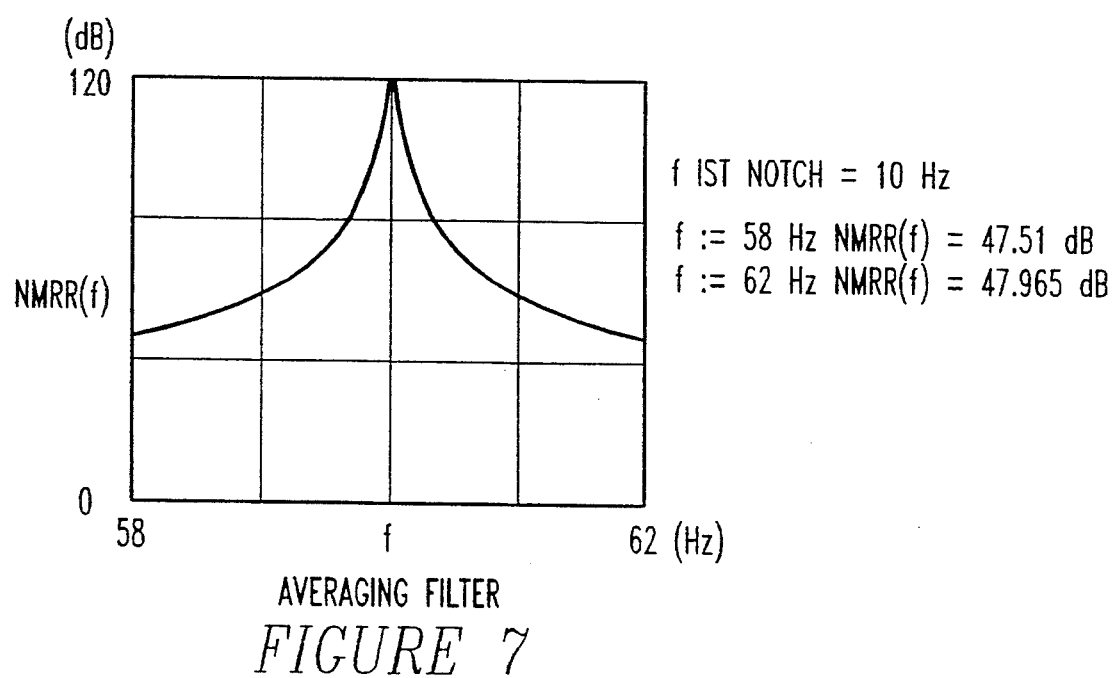
FIG. 7 is the same characteristics as of FIG. 4 for frequency range to 58 to 60 Hz.
Figure 8:
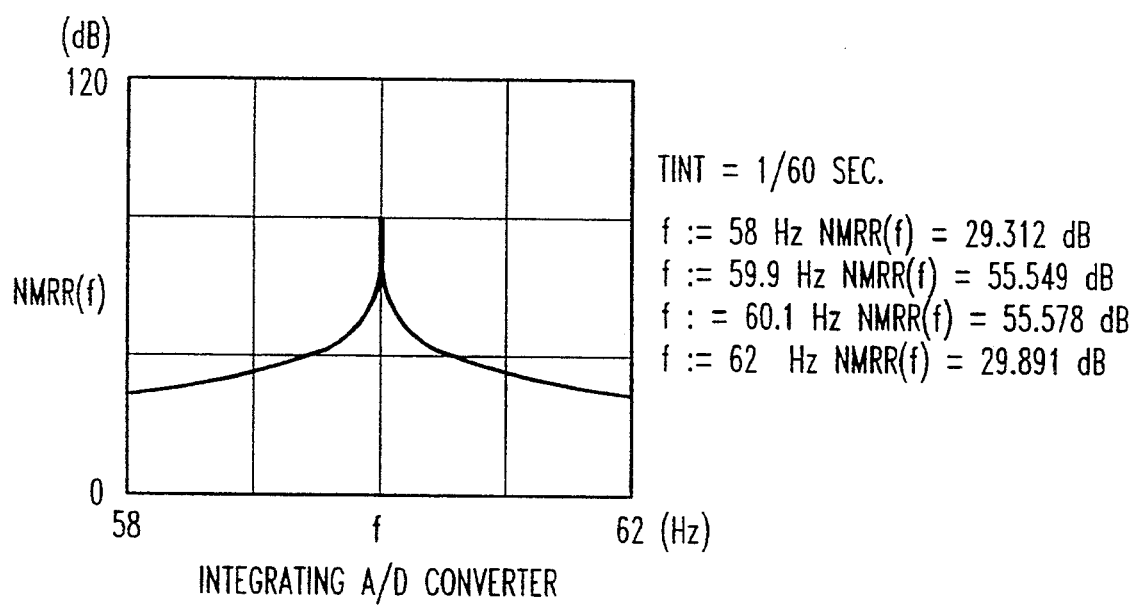
FIG. 8 is the same characteristics as of FIG. 5 for frequency range of 58 to 60 Hz.
Figure 9:
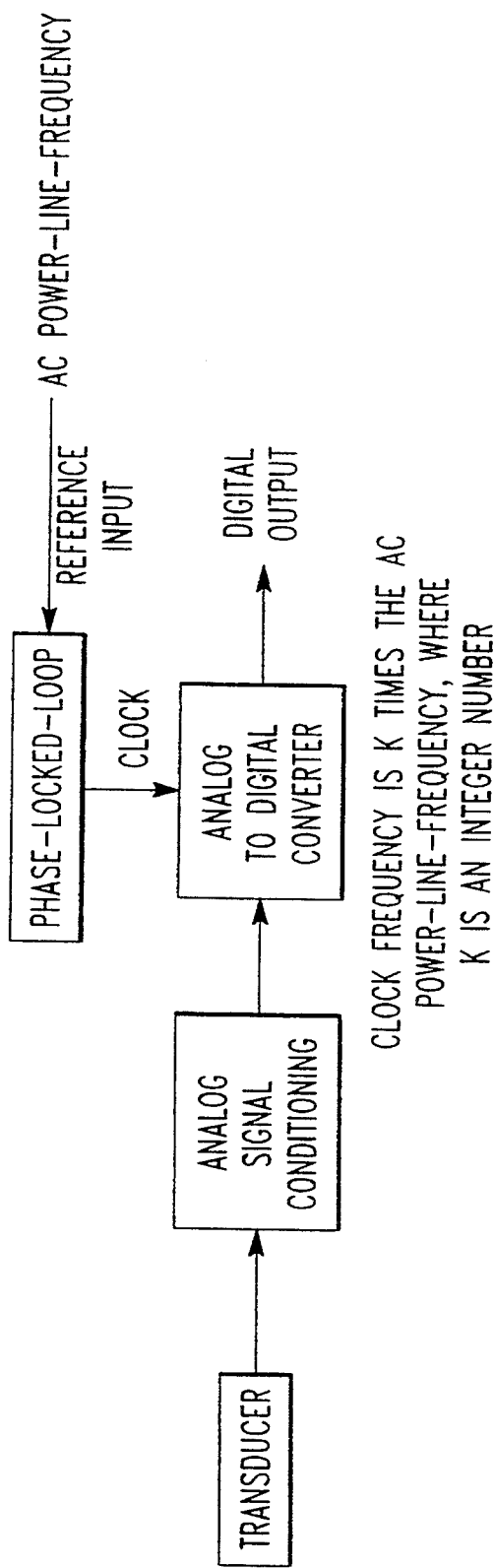
FIG. 9 is a simplified block diagram of a first preferred embodiment of the invention.
Figure 12:
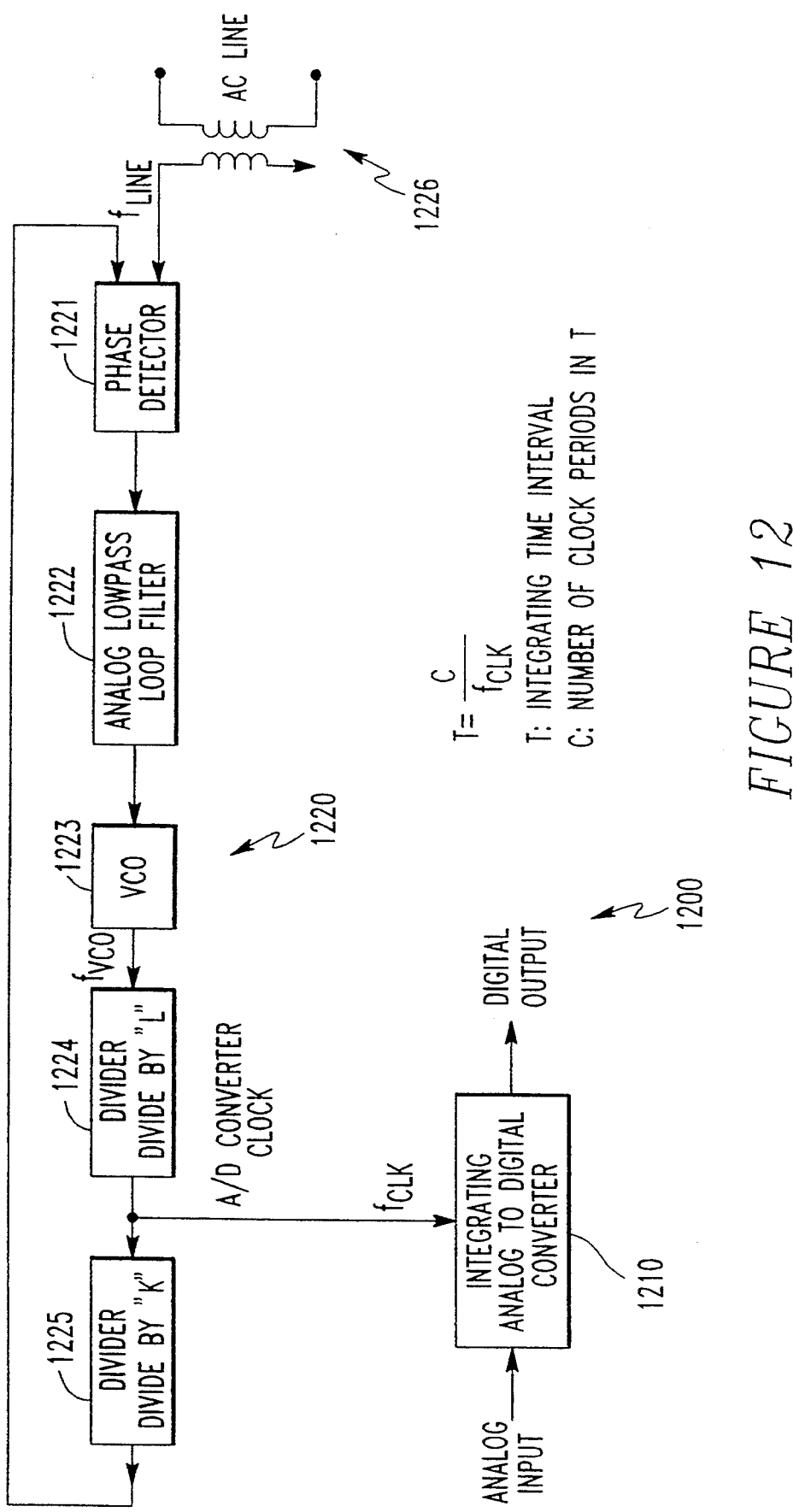
FIG. 12 is a simplified block diagram of a preferred embodiment of the invention for an integrating A/D converter.

FIG. 12 schematically shows third preferred embodiment integrating A/D converter, generally denoted with reference numeral 1200, which includes integrating A/D converter 1210 of any type (dual slope, multi slope), and phase-locked-loop 1220. As was described for the first preferred embodiment, phase-locked-loop 1220 provides a clock for integrating MD converter 1210 which is locked to AC line-frequency, $f_{LINE}$, so that $f_{CLK} = K \times f_{LINE}$. The integrating A/D converter 1210 integrates the input signal for a fixed interval of time, T, which equals C clock periods where C is an integer and an A/D converter design parametr. So, $T = C/f_{CLK}$. The notch frequencies of the NMRR of the integrating A/D converter 1210 are located at $f_{nth\ notch} = n/T$. (Note that other notch frequencies exist in FIG. 5, at frequencies of $(j + 0.5)/T$ for $j = 0, 1, 2, ...$; however, these frequencies are the functions of T and also of the phase P.) Substituting $T = C/f_{CLK}$ and $f_{CLK} = K \times f_{LINE}$ will yield $f_{nth-notch} = (n \times K/C) f_{LINE}$. Hence, AC line noise at frequency $f_{LINE}$ is specifically removed during integration cycle when the phase-locked-loop 1220 and A/D converter 1210 are designed so that $n \times K/C = 1$. This will insure that AC line-frequency will fall in the nth-notch of the A/D converter 1210 and will be effectively rejected. This will also insure that any deviation in the AC line-frequency from its nominal 50 Hz or 60 Hz will be followed by $f_{CLK}$ and hence by $f_{nth\text{-}notch}$. Further, the harmonics of the AC line-frequency will then fall into higher notch frequencies and also be rejected. In particular, for an integrating A/D converter with nominal clock frequency of 60 KHz and C designed to be 1000, the design will be as follows. T will be 1/60 second and referring to equation n×K/C=1, yields n=1 and K=1000. Choosing a value of L=2 will give a VCO with nominal frequency of 120 KHz. For these values, $F_{LINE}$=60 Hz will yield $f_{CLK}$=60000 Hz, $f_{LINE}$=58 will give $f_{CLK}$=58000 Hz, and $f_{LINE}$=62 will lead to $f_{CLK}$=62000 Hz.

Further Modifications and Variations

The preferred embodiments may be modified in many ways while retaining the feature of a converter clock frequency locked to a multiple of AC line frequency in order to reject AC line noise.

For example, the detailed description computations were based on rejection of noise centered about 60 Hz. The same methodology applies for rejection of 50 Hz centered noise in 50 Hz power systems. Further, the same methodology applies for rejection of 400 and 440 Hz noise in the aircraft power systems, where AC power is generated at 400 Hz or 440 Hz. Indeed, the method can be applied for rejection of any variable periodic source of noise, superimposed on a signal of interest, provided that a reference frequency of the noise source is available for phase-locked-loop input.

Further, the comb filter in the first preferred embodiment or the averaging filter in the second preferred embodiment could be replaced with any other filter type which has a stopband about $f_{LINE}$; of course, the stopband would vary with $f_{CLK}$ and thereby track $f_{LINE}$.

I claim:

1. An analog-to-digital converter, comprising:
   (a) a sigma-delta modulator;
   (b) a digital filter coupled to said modulator;
   (c) a clock generator providing clock signals at a clock frequency to said modulator and to said filter, wherein said clock frequency is a fixed multiple of a variable power line frequency; and
   (d) wherein said digital filter is a comb filter with a notch at a fixed fraction of said clock frequency which equals said power line frequency.
2. The converter of claim 1, wherein:
   (a) said power line frequency is centered at 60 Hz.
3. The converter of claim 1, wherein:
   (a) said power line frequency is centered at 50 Hz.
4. The converter of claim 1, wherein:
   (a) said clock generator includes a phase-loop coupled to a power line at said power line frequency.
5. An analog-to-digital converter, comprising:
   (a) a sigma-delta modulator;
   (b) a digital filter coupled to said modulator;
   (c) a clock generator providing clock signals at a clock frequency $f_{CLK}$ to said modulator and to said filter, said clock generator includes a phase-locked-loop coupled to an AC power line at a frequency $f_{LINE}$ which may vary but fixes $f_{CLK}=Kf_{LINE}$ for a positive integer K; and
   (d) wherein said digital filter has a stopband at $f_{LINE}$.
6. The converter of claim 5, wherein:
   (a) said filter includes a first filter coupled to a second filter, said first filter decimating the sampling rate of said modulator down to a frequency $Mf_{LINE}$ with M a positive integer, and said second filter having a stopband at $f_{LINE}$.
7. The converter of claim 6, wherein:
   (a) said second filter is an averaging filter which averages M samples.
8. The converter of claim 7, wherein:
   (a) M equals 4.
9. The converter of claim 7, wherein:
   (a) said first filter is a comb filter with a first notch greater than $f_{LINE}$.
10. An integrating analog-to-digital converter (dual/multislope), comprising:
    (a) a signal integrator driven by a clock generator;
    (b) said clock generator providing clock signals at a clock frequency $f_{CLK}$ coupled to said signal integrator, said clock generator including a phase-locked-loop coupled to an AC power line operating at frequency $f_{LINE}$ which may vary but fixes $f_{CLK}=Kf_{LINE}$ for a positive integer K;
    (c) wherein the duration of an integrating interval by said signal integrator is an integer multiple of $1/f_{LINE}$; and
    (d) wherein the clock frequency of the analog-to-digital converter is continuously adapted to the AC power line frequency.
11. An analog-to-digital converter comprising:
    (a) a sigma-delta modulator;
    (b) a digital filter coupled to said modulator;
    (c) a clock generator providing clock signals at a clock frequency to said modulator and to said filter, wherein said clock frequency is a fixed multiple of a variable power line frequency; and
    wherein said digital filter includes:
    (i) a low pass filter with a cutoff frequency higher than said lower line frequency; and
    (ii) an averaging filter coupled to an output of said low pass filter, said averaging filter averaging a fixed integral number of samples for a period of said power line frequency.
12. The converter of claim 11, wherein:
    (a) said clock generator includes a phase-locked-loop coupled to a power line at said power line frequency.
13. The converter of claim 11, wherein:
    (a) said power line frequency is centered at 60 Hz.
14. The converter of claim 11, wherein:
    (a) said power line frequency is centered at 50 Hz.
15. An analog-to-digital converter comprising:
    (a) a sigma-delta modulator;
    (b) a digital filter coupled to said modulator;
    (c) a clock generator providing clock signals at a clock frequency $f_{CLK}$ to said modulator and to said filter, said clock generator includes a phase-locked-loop coupled to an AC power line at a frequency $f_{LINE}$ which may vary but fixes $f_{CLK}=Kf_{LINE}$ for a positive integer K; and
    (d) wherein said digital filter is an Nth order comb filter with a notch at $f_{LINE}$.
16. The converter of claim 15, wherein:
    (a) said notch is the nth notch for a positive integer n.

* * * * *